(12) United States Patent
Kim et al.

(10) Patent No.: US 11,837,551 B2
(45) Date of Patent: Dec. 5, 2023

(54) SEMICONDUCTOR PACKAGE

(71) Applicant: Samsung Electronics Co., Ltd., Suwon-si (KR)

(72) Inventors: Jongyoun Kim, Seoul (KR); Seokhyun Lee, Hwaseong-si (KR); Gwangjae Jeon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 263 days.

(21) Appl. No.: 17/215,517

(22) Filed: Mar. 29, 2021

(65) Prior Publication Data

US 2022/0077066 A1    Mar. 10, 2022

(30) Foreign Application Priority Data

Sep. 9, 2020 (KR) .................... 10-2020-0115325

(51) Int. Cl.
*H01L 23/538* (2006.01)
*H01L 23/00* (2006.01)

(52) U.S. Cl.
CPC ...... *H01L 23/5384* (2013.01); *H01L 23/5386* (2013.01); *H01L 24/14* (2013.01)

(58) Field of Classification Search
CPC .. H01L 23/5384; H01L 23/5386; H01L 24/14
See application file for complete search history.

(56) References Cited

U.S. PATENT DOCUMENTS

| | | | |
|---|---|---|---|
| 8,859,912 B2 | 10/2014 | Tseng et al. | |
| 10,497,660 B2 | 12/2019 | Chen | |
| 2010/0096171 A1* | 4/2010 | Lee | H05K 3/4007 156/247 |
| 2013/0008705 A1* | 1/2013 | Tseng | H01L 21/4857 29/829 |
| 2017/0373029 A1* | 12/2017 | Seol | H01L 23/3107 |
| 2019/0131235 A1 | 5/2019 | Wang et al. | |
| 2020/0152565 A1 | 5/2020 | Choi et al. | |

FOREIGN PATENT DOCUMENTS

| | | |
|---|---|---|
| CN | 108054137 A | 5/2018 |
| CN | 109326531 A | 2/2019 |
| JP | 2015-038909 A | 2/2015 |

* cited by examiner

*Primary Examiner* — Errol V Fernandes
(74) *Attorney, Agent, or Firm* — HARNESS, DICKEY & PIERCE, P.L.C.

(57) ABSTRACT

A semiconductor package includes a redistribution substrate having a semiconductor chip mounted on a top surface thereof with and a connection terminal between the semiconductor chip and the redistribution substrate. The redistribution substrate includes a first redistribution pattern on a bottom surface of the connection terminal and comprising a first via and a first interconnection on the first via, a pad pattern between the first redistribution pattern and the connection terminal and comprising a pad via and a pad on the pad via, and a second redistribution pattern between the first redistribution pattern and the pad pattern and comprising a second via and a second interconnection on the second via with a recess region where a portion of a top surface of the second interconnection is recessed. A bottom surface of the recess region is located at a lower level than a topmost surface of the second interconnection.

16 Claims, 14 Drawing Sheets

SEMICONDUCTOR PACKAGE

CROSS-REFERENCE TO RELATED APPLICATION

This U.S. non-provisional patent application claims priority under 35 U.S.C. § 119 to Korean Patent Application No. 10-2020-0115325, filed on Sep. 9, 2020, in the Korean Intellectual Property Office, the disclosure of which is hereby incorporated by reference in its entirety.

BACKGROUND

Example embodiments of the inventive concepts relate to a semiconductor package. For example, at least some example embodiments relate to a semiconductor package including a redistribution substrate.

An integrated circuit chip may be realized in the form of a semiconductor package so as to be appropriately applied to an electronic product. In a typical semiconductor package, a semiconductor chip may be mounted on a printed circuit board (PCB) and may be electrically connected to the PCB through bonding wires or bumps. Various techniques for improving reliability of semiconductor packages and for miniaturizing semiconductor packages have been studied with the development of an electronic industry.

SUMMARY

Example embodiments of the inventive concepts may provide a semiconductor package with improved reliability and electrical characteristics.

In an example embodiment, a semiconductor package may include a semiconductor chip; a connection terminal; and a redistribution substrate configured to electrically connect to the semiconductor chip via the connection terminal, the redistribution substrate including, a pad pattern including a pad via and a pad on the pad via, and a first redistribution pattern including a first via and a first interconnection on the first via, and a second redistribution pattern between the first redistribution pattern and the pad pattern, the second redistribution pattern including a second via and a second interconnection on the second via, the second interconnection having a recess region therein where a portion of a top surface of the second interconnection is recessed with a bottom surface of the recess region located at a lower level than a topmost surface of the second interconnection.

In an example embodiment, a semiconductor package may include a semiconductor chip; a connection terminal; a redistribution substrate configured to electrically connect to the semiconductor chip via the connection terminal, the redistribution substrate including, an under bump pattern, a first redistribution pattern on the under bump pattern, a second redistribution pattern on the first redistribution pattern, the second redistribution pattern including a second via and a second interconnection on the second via, the second interconnection having a recess region therein where a portion of a top surface of the second interconnection is recessed, at least one fine pattern on the under bump pattern and laterally spaced apart from the first redistribution pattern and the second redistribution pattern, an insulating layer covering the first redistribution pattern, the second redistribution pattern and the at least one fine pattern, a pad pattern including a pad via and a pad on the pad via, and a pad seed pattern between the pad pattern and the insulating layer, the pad seed pattern covering an inner sidewall and a bottom surface of the recess region; and an external terminal on a bottom surface of the redistribution substrate such that the external terminal contacts the under bump pattern.

In an example embodiment, a semiconductor package may include a semiconductor chip; a redistribution substrate configured to have the semiconductor chip mounted on a top surface thereof, the redistribution substrate including, a pad pattern including a pad and a pad via on the pad, a first redistribution pattern on the pad pattern, the pad including an opening where a portion of a bottom surface of the pad is recessed toward the pad via with a bottom surface of the opening being higher than a bottommost surface of the pad, a second redistribution pattern between the pad pattern and the first redistribution pattern, the second redistribution pattern including a second interconnection and a second via on the second interconnection, the second interconnection having a recess region therein where a portion of a bottom surface of the second interconnection is recessed toward the second via with a bottom surface of the recess region being higher than a bottommost surface of the second interconnection, an insulating layer covering the first redistribution pattern and the second redistribution pattern, and a pad seed pattern between the pad pattern and the insulating layer; and an external terminal on a bottom surface of the redistribution substrate such that the external terminal contacts the pad.

BRIEF DESCRIPTION OF THE DRAWINGS

Example embodiments of the inventive concepts will become more apparent in view of the attached drawings and accompanying detailed description.

DETAILED DESCRIPTION

Hereinafter, example embodiments of the inventive concepts will be described in more detail with reference to the accompanying drawings.

Figure 1:
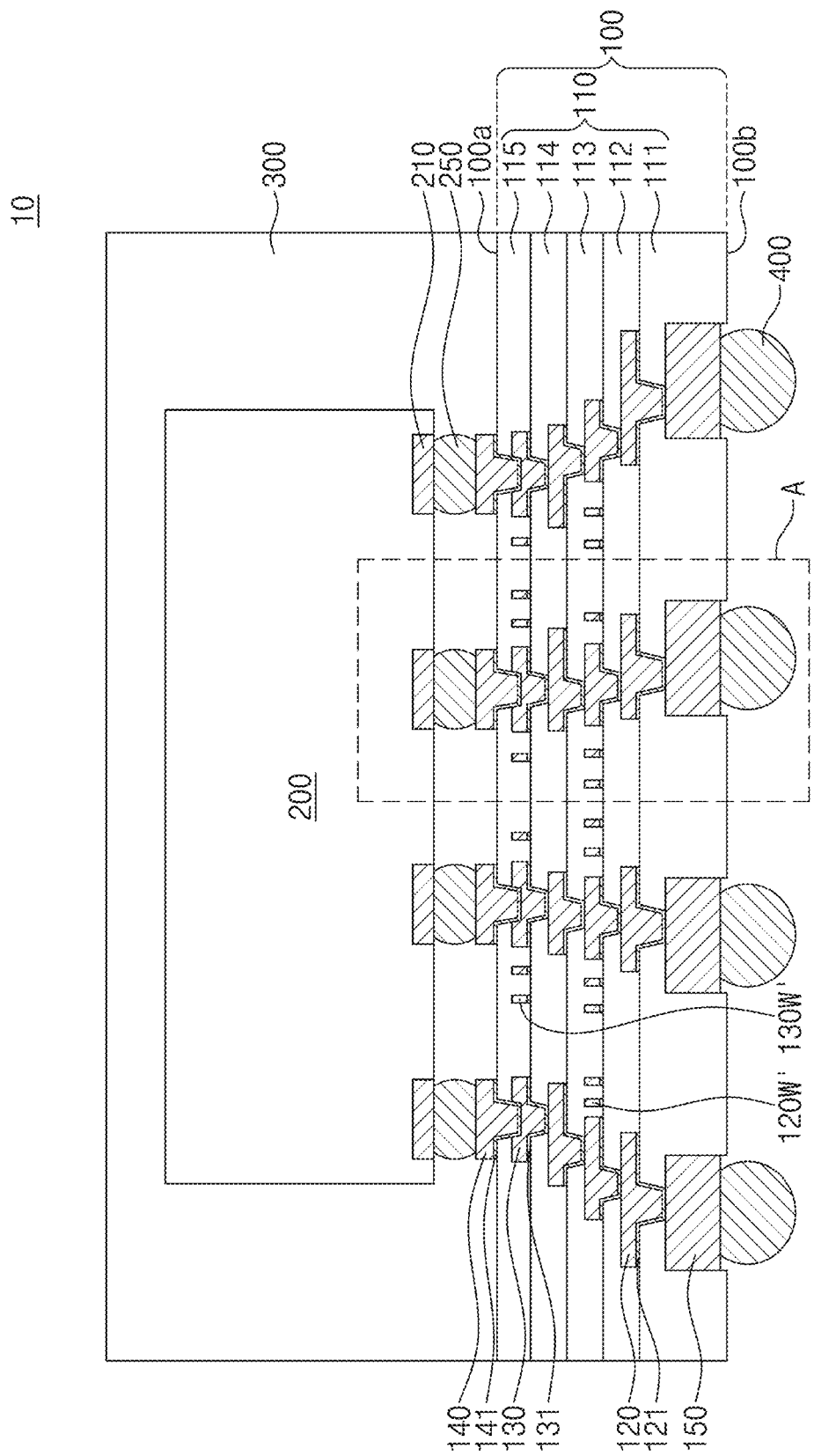
FIG. 1 is a cross-sectional view illustrating a semiconductor package according to some example embodiments of the inventive concepts.
Figure 2:
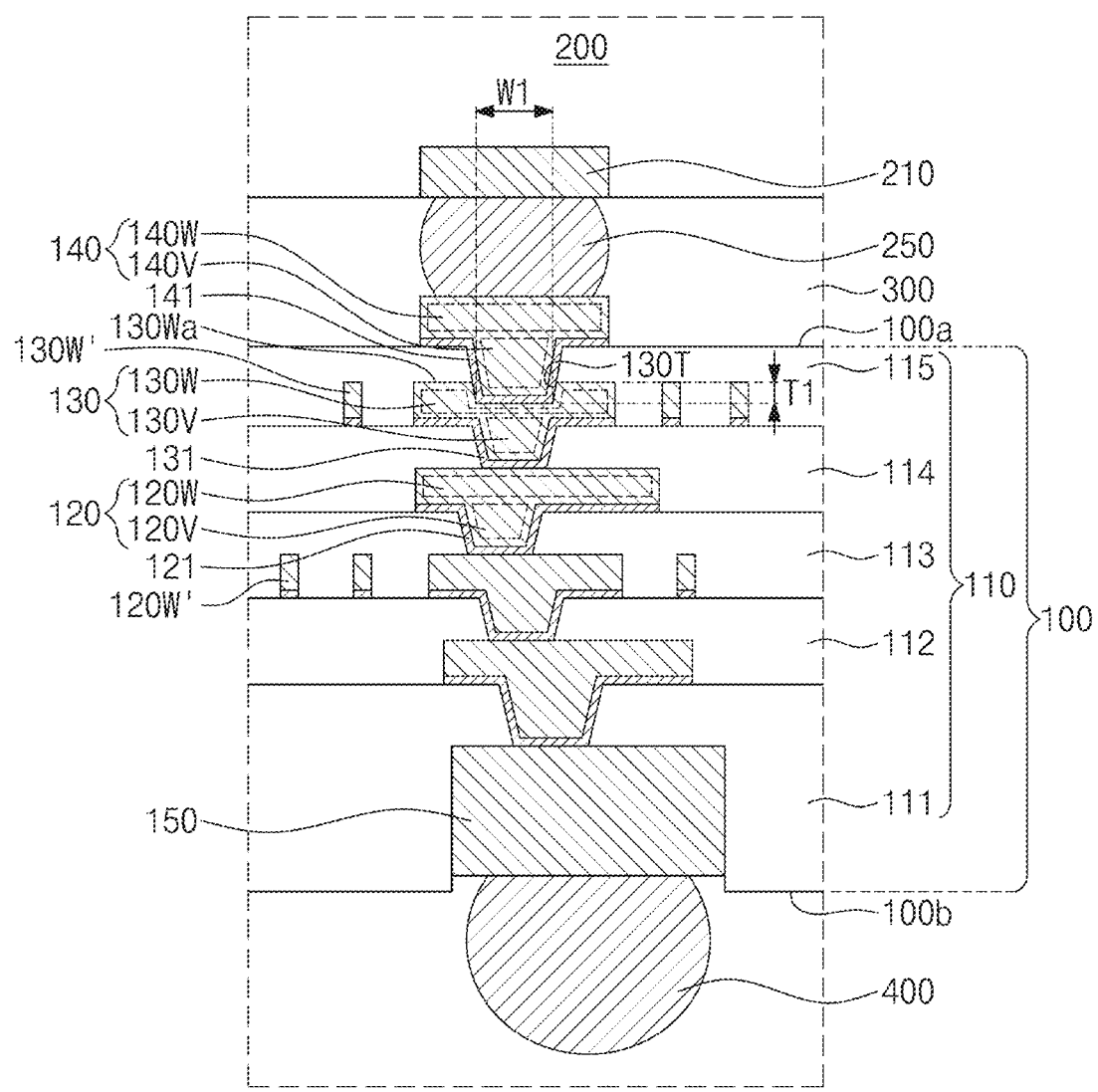
FIG. 2 is an enlarged cross-sectional view of a region 'A' of FIG. 1.

FIG. 1 is a cross-sectional view illustrating a semiconductor package according to some example embodiments of the inventive concepts. FIG. 2 is an enlarged cross-sectional view of a region 'A' of FIG. 1.

Referring to FIGS. 1 and 2, a semiconductor package 10 may include a redistribution substrate 100 including an insulating layer 110, a first redistribution pattern 120, a second redistribution pattern 130 and a pad pattern 140; a semiconductor chip 200 provided on a top surface 100a of the redistribution substrate 100; a connection terminal 250 provided between the redistribution substrate 100 and the semiconductor chip 200; and an external terminal 400 provided on a bottom surface 100b of the redistribution substrate 100.

The redistribution substrate 100 may include the first redistribution pattern 120 disposed below a bottom surface of the connection terminal 250, the pad pattern 140 disposed between the first redistribution pattern 120 and the connection terminal 250, and the second redistribution pattern 130 disposed between the first redistribution pattern 120 and the pad pattern 140. The redistribution substrate 100 may further include an under bump pattern 150 on the external terminal 400, and fine patterns 120W' and 130W'. The redistribution substrate 100 may be a wafer-level substrate or a panel-level substrate.

The insulating layer 110 may cover the first redistribution pattern 120, the second redistribution pattern 130, the under bump pattern 150, and the fine patterns 120W' and 130W'. The insulating layer 110 may include first to fifth insulating layers 111, 112, 113, 114 and 115 which are sequentially stacked. The first insulating layer 111 may be a lowermost insulating layer of the insulating layer 110, and the fifth insulating layer 115 may be an uppermost insulating layer of the insulating layer 110. The first to fifth insulating layers 111, 112, 113, 114 and 115 may include an organic material such as a photosensitive polymer. For example, the photosensitive polymer may include at least one of photosensitive polyimide, polybenzoxazole, a phenol-based polymer, or a benzocyclobutene-based polymer. In some example embodiments, the insulating layer 110 may include, but not limited to, a photo imageable dielectric (PID). The first to fifth insulating layers 111, 112, 113, 114 and 115 may include the same material, and thus interfaces between the first to fifth insulating layers 111, 112, 113, 114 and 115 may not be distinguished or visible. However, example embodiments of the inventive concepts are not limited thereto.

The external terminal 400 may be provided on the bottom surface 100b of the redistribution substrate 100. The external terminal 400 may be provided in plurality, and the plurality of external terminals 400 may be spaced apart from each other in a direction parallel to the top surface 100a of the redistribution substrate 100. The external terminal 400 may include at least one of a solder, a pillar, or a bump. The external terminal 400 may include a conductive metal material and may include at least one metal of, for example, tin (Sn), lead (Pb), nickel (Ni), gold (Au), silver (Ag), copper (Cu), aluminum (Al), or bismuth (Bi). The external terminal 400 may be connected to an external device (not shown). In the present specification, it will be understood that when a component is referred to as being "electrically connected" to another component, it may be connected directly to the other component or an intervening component may be present.

The under bump pattern 150 may be provided in the first insulating layer 111. The under bump pattern 150 may be provided in plurality, and the plurality of under bump patterns 150 may be spaced apart from each other in the direction parallel to the top surface 100a of the redistribution substrate 100. Each of the under bump patterns 150 may be provided on a top surface of a corresponding one of the external terminals 400. The under bump pattern 150 may be in contact with the external terminal 400. The first insulating layer 111 may cover a top surface and a sidewall of the under bump pattern 150. The first insulating layer 111 may expose a bottom surface of the under bump pattern 150. The bottom surface of the under bump pattern 150 may be located at a higher level than the bottom surface 100b of the redistribution substrate 100. In the present specification, the term 'level' may mean a height from the bottom surface 100b of the redistribution substrate 100. The under bump pattern 150 may function as a pad of the external terminal 400. The under bump pattern 150 may include a conductive metal material, for example, copper (Cu).

The first redistribution pattern 120 may be provided on the under bump pattern 150. The first redistribution pattern 120 may be provided in plurality, and the plurality of first redistribution patterns 120 may be spaced apart from each other in the direction parallel to the top surface 100a of the redistribution substrate 100. Each of the first redistribution patterns 120 may be provided on a corresponding one of the under bump patterns 150. In addition, a plurality of the first redistribution patterns 120 may be stacked in a direction perpendicular to the top surface 100a of the redistribution substrate 100. The first redistribution pattern 120 may include a conductive metal material, for example, copper (Cu).

Each of the first redistribution patterns 120 may include a first via 120V and a first interconnection 120W. The first interconnection 120W may be provided on the first via 120V. The first interconnections 120W may be disposed on top surfaces of the first to third insulating layers 111, 112 and 113. The insulating layer 110 may cover a sidewall and a top surface of the first interconnection 120W. Particularly, the second to fourth insulating layers 112, 113 and 114 may cover the sidewalls and the top surfaces of the first interconnections 120W. The first vias 120V may be disposed in the first to third insulating layers 111, 112 and 113.

The first interconnection 120W may have a long axis extending in the direction parallel to the top surface 100a of the redistribution substrate 100. A width of the first interconnection 120W may be greater than a width of the first via 120V. The first via 120V may have a shape protruding from the first interconnection 120W toward the bottom surface 100b of the redistribution substrate 100. A top width of the first via 120V may be greater than a bottom width of the first via 120V.

A first seed pattern 121 may be disposed between the insulating layer 110 and a bottom surface of the first redistribution pattern 120. The first seed pattern 121 may be provided in plurality, and each of the first seed patterns 121 may be disposed on the bottom surface of a corresponding one of the first redistribution patterns 120. The first seed pattern 121 on the bottom surface of a lowermost one of the first redistribution patterns 120 may be in direct contact with the under bump pattern 150. The first seed pattern 121 on the bottom surface of the lowermost one of the first redistribution patterns 120 may be disposed between a bottom surface of the first via 120V and a top surface of the under bump pattern 150, between a sidewall of the first via 120V and the first insulating layer 111 and between a bottom surface of the first interconnection 120W and the first insulating layer 111. Each of the first seed patterns 121 on the bottom surfaces of the first redistribution patterns 120 on the lowermost first redistribution pattern 120 may be disposed between a bottom surface of the first via 120V and a top surface of the first redistribution pattern 120 disposed thereunder, between a sidewall of the first via 120V and the insulating layer 110 and between a bottom surface of the first interconnection 120W and the insulating layer 110. The first seed pattern 121 may include a conductive metal material, for example, copper (Cu), titanium (Ti), and/or any alloy thereof.

A first fine pattern 120W' may be provided on a top surface of the second insulating layer 112. The first fine pattern 120W' may be provided in plurality, and the plurality of first fine patterns 120W' may be spaced apart from each other in the direction parallel to the top surface 100a of the redistribution substrate 100. The first fine patterns 120W' may be disposed between the first redistribution patterns 120. The first seed pattern 121 may also be provided on a bottom surface of each of the first fine patterns 120W'. The first seed pattern 121 may be disposed between the insulating layer 110 and the bottom surface of each of the first fine patterns 120W'. Even though not shown in the drawings, each of the first fine patterns 120W' may be electrically connected to the first interconnection 120W or the first via 120V. The first fine patterns 120W' and the first interconnection 120W may be formed by a single process. The first fine patterns 120W' may include a conductive metal material, for example, copper (Cu).

However, the numbers of the first redistribution patterns 120 and the first seed patterns 121 are not limited to the drawings. In certain example embodiments, unlike FIGS. 1 and 2, one or some of the first to third insulating layers 111, 112 and 113 may be omitted, and thus one or some of the stacked first redistribution patterns 120 and one or some of the stacked first seed patterns 121 may also be omitted.

The second redistribution pattern 130 may be provided on an uppermost one of the first redistribution patterns 120. The second redistribution pattern 130 may be provided in plurality, and the plurality of second redistribution patterns 130 may be spaced apart from each other in the direction parallel to the top surface 100a of the redistribution substrate 100. The second redistribution pattern 130 may include a conductive metal material, for example, copper (Cu).

Each of the second redistribution patterns 130 may include a second via 130V and a second interconnection 130W. The second interconnection 130W may be disposed on the second via 130V. The second interconnections 130W may be disposed on a top surface of the fourth insulating layer 114. The insulating layer 110 may cover a sidewall and a top surface of the second interconnection 130W. Particularly, the fifth insulating layer 115 may cover the sidewalls and the top surfaces of the second interconnections 130W. The second vias 130V may be disposed in the fourth insulating layer 114.

The second interconnection 130W may have a long axis extending in the direction parallel to the top surface 100a of the redistribution substrate 100. A width of the second interconnection 130W may be greater than a width of the second via 130V. At least a portion of the top surface of the second interconnection 130W may be recessed, and thus the second interconnection 130W may include a recess region 130T recessed toward the second via 130V. For example, the recess region 130T may have a tapered shape of which a width becomes less toward its bottom. In other words, a dimple structure which is concave toward the bottom surface 100b of the redistribution substrate 100 (i.e., toward the inside of the second interconnection 130W) may be formed in the top surface of the second interconnection 130W. A bottom surface of the recess region 130T may be located at a lower level than a topmost surface 130Wa of the second interconnection 130W. A thickness T1 between the bottom surface of the recess region 130T and the topmost surface 130Wa of the second interconnection 130W may range from 1 μm to 5 μm (particularly, from 1 μm to 3 μm). In the present specification, the term 'thickness' may mean a distance measured in the direction perpendicular to the top surface 100a of the redistribution substrate 100. A width W1 of the bottom surface of the recess region 130T may range from 5 μm to 15 μm (particularly, from 8 μm to 12 μm). In the present specification, the term 'width' may mean a distance measured in the direction parallel to the top surface 100a of the redistribution substrate 100. The second via 130V may have a shape protruding from the second interconnection 130W toward the bottom surface 100b of the redistribution substrate 100. A top width of the second via 130V may be greater than a bottom width of the second via 130V.

A second seed pattern 131 may be disposed between the insulating layer 110 and a bottom surface of the second redistribution pattern 130. The second seed pattern 131 may be provided in plurality, and each of the second seed patterns 131 may be disposed on the bottom surface of a corresponding one of the second redistribution patterns 130. The second seed pattern 131 may be in direct contact with the uppermost first redistribution pattern 120 of the first redistribution patterns 120. The second seed pattern 131 may be disposed between a bottom surface of the second via 130V and the top surface of the uppermost first redistribution pattern 120, between a sidewall of the second via 130V and the fourth insulating layer 114 and between a bottom surface of the second interconnection 130W and the fourth insulating layer 114. The second seed pattern 131 may include a conductive metal material, for example, copper (Cu), titanium (Ti), and/or any alloy thereof.

A second fine pattern 130W' may be provided on the top surface of the fourth insulating layer 114. The second fine pattern 130W' may be provided in plurality, and the plurality of second fine patterns 130W' may be spaced apart from each other in the direction parallel to the top surface 100a of the redistribution substrate 100. The second fine patterns 130W' may be disposed between the second redistribution patterns 130. The second seed pattern 131 may also be provided on a bottom surface of each of the second fine patterns 130W'. The second seed pattern 131 may be disposed between the insulating layer 110 and the bottom surface of each of the second fine patterns 130W'. Even though not shown in the drawings, each of the second fine patterns 130W' may be electrically connected to the second interconnection 130W or the second via 130V. The second fine patterns 130W' and the second interconnection 130W may be formed by a single process. The second fine patterns 130W' may include a conductive metal material, for example, copper (Cu).

The pad pattern 140 may be provided on the second redistribution pattern 130. The pad pattern 140 may be provided in plurality, and the plurality of pad patterns 140 may be spaced apart from each other in the direction parallel to the top surface 100a of the redistribution substrate 100. The pad pattern 140 may include a conductive metal material, for example, copper (Cu).

Each of the pad patterns 140 may include a pad via 140V and a pad 140W. The pad 140W may be provided on the pad via 140V. The pad 140W may be disposed on a top surface of the fifth insulating layer 115. The pad via 140V may be disposed in the fifth insulating layer 115.

The pad 140W may have a long axis extending in the direction parallel to the top surface 100a of the redistribution substrate 100. A width of the pad 140W may be greater than a width of the pad via 140V. The pad via 140V may have a shape protruding from the pad 140W toward the bottom surface 100b of the redistribution substrate 100. A top width of the pad via 140V may be greater than a bottom width of the pad via 140V. The fifth insulating layer 115 may cover the pad via 140V. The pad 140W may not be covered by the fifth insulating layer 115 but may be exposed on the top surface 100a of the redistribution substrate 100.

A pad seed pattern 141 may be provided on the second redistribution pattern 130. The pad seed pattern 141 may be in direct contact with the second redistribution pattern 130. The pad seed pattern 141 may cover the bottom surface and both inner sidewalls of the recess region 130T and may extend along the both inner sidewalls of the recess region 130T onto portions of the top surface of the fifth insulating layer 115. The pad seed pattern 141 may be disposed between a bottom surface of the pad via 140V and the bottom surface of the recess region 130T, between a sidewall of the pad via 140V and the inner sidewall of the recess region 130T, between the sidewall of the pad via 140V and the fifth insulating layer 115 and between a bottom surface of the pad 140W and the fifth insulating layer 115. The pad seed pattern 141 may include a conductive metal material, for example, copper (Cu), titanium (Ti), and/or any alloy thereof.

Typically, as a width of a pad via is reduced by miniaturization of a semiconductor package, a contact area between the pad via and a redistribution pattern may be reduced. In this case, when thermal stress is applied to the semiconductor package, a crack may occur at the pad via or a disconnection phenomenon may occur.

However, according to one or more example embodiments of the inventive concepts, the dimple structure in which the top surface of the second interconnection 130W is concavely recessed may be formed, and thus a contact area between the pad via 140V and the second redistribution pattern 130 may be increased. As a result, even though thermal stress is applied, it is possible to reduce (or, alternatively, prevent) occurrence of a crack of the pad via and/or a disconnection phenomenon. In addition, according to one or more example embodiments of the inventive concepts, the dimple structure may be selectively formed in a redistribution pattern, having a high probability of occurrence of a crack, of the redistribution patterns. Thus, occurrence of undulations of the top surfaces of the first redistribution patterns 120 may be reduced or minimized to inhibit (or, alternatively, prevent) failure of electrical connection. In other words, according to the example embodiments of the inventive concepts, the semiconductor package with improved reliability and electrical characteristics against thermal stress may be provided or realized.

The semiconductor chip 200 may be mounted on the top surface 100a of the redistribution substrate 100. For example, the semiconductor chip 200 may be a memory chip, a logic chip, or a sensing chip. However, example embodiments of the inventive concepts are not limited thereto. The memory chip may be, for example, a DRAM chip, a SRAM chip, a MRAM chip, or a flash memory chip. The semiconductor chip 200 may include chip pads 210 provided in a lower portion of the semiconductor chip 200. The chip pads 210 may be electrically connected to integrated circuits of the semiconductor chip 200 through interconnection lines.

The connection terminal 250 may be provided on the pad pattern 140. The connection terminal 250 may be disposed between the semiconductor chip 200 and the redistribution substrate 100. The connection terminal 250 may be disposed between the pad pattern 140 and the chip pad 210 and may be electrically connected to the pad pattern 140 and the chip pad 210. In other words, the semiconductor chip 200 may be electrically connected to the external terminal 400 through the connection terminal 250. The connection terminal 250 may be provided in plurality, and the plurality of connection terminals 250 may be spaced apart from each other in the direction parallel to the top surface 100a of the redistribution substrate 100. Each of the connection terminals 250 may be connected to a top surface of the pad pattern 140. The connection terminal 250 may include at least one of a solder, a pillar, or a bump. The connection terminal 250 may include a conductive metal material and may include at least one metal of, for example, tin (Sn), lead (Pb), nickel (Ni), gold (Au), silver (Ag), copper (Cu), aluminum (Al), or bismuth (Bi).

A molding layer 300 may be provided on the redistribution substrate 100. The molding layer 300 may cover the top surface 100a of the redistribution substrate 100 and the semiconductor chip 200. The molding layer 300 may cover the top surface of the fifth insulating layer 115 and may extend into a gap between the semiconductor chip 200 and the redistribution substrate 100 to seal or surround the connection terminal 250 and the pad 140W. The molding layer 300 may include an insulating polymer such as an epoxy molding compound (EMC).

FIGS. 3 to 8 are cross-sectional views illustrating a method for manufacturing a semiconductor package according to some example embodiments of the inventive concepts. Hereinafter, the descriptions to the same features as mentioned above will be omitted for the purpose of ease and convenience in explanation.

Figure 3:
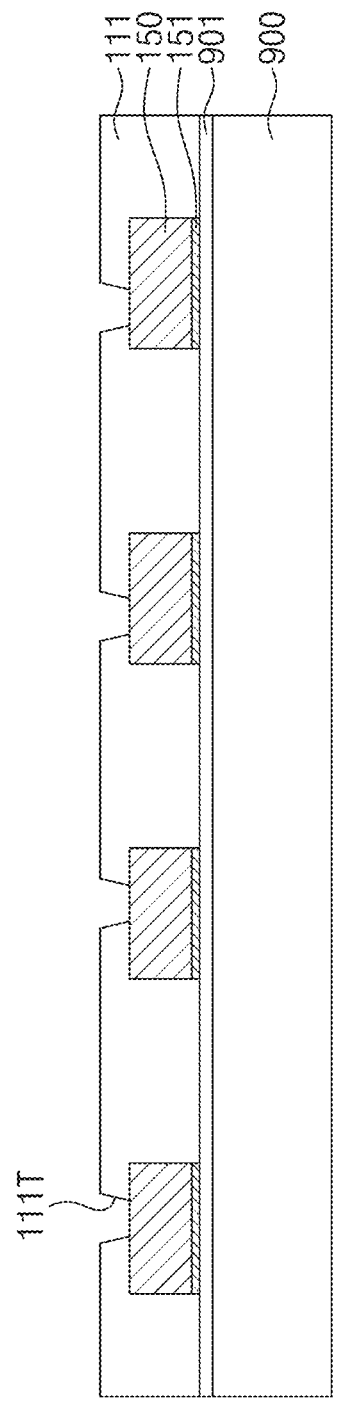
FIGS. 3 to 8 are cross-sectional views illustrating a method for manufacturing a semiconductor package according to some example embodiments of the inventive concepts.

Referring to FIG. 3, a carrier adhesive layer 901 may be formed on a carrier substrate 900. The carrier adhesive layer 901 may adhere a first insulating layer 111 to the carrier substrate 900. A lower seed pattern 151 may be formed on the carrier adhesive layer 901. The lower seed pattern 151 may be formed in plurality. The lower seed patterns 151 may be formed by a deposition process and an etching process. An under bump pattern 150 may be formed on the lower seed pattern 151. The under bump pattern 150 may be formed in plurality. The under bump patterns 150 may be formed by an electroplating process using the lower seed patterns 151 as electrodes and an etching process.

A first insulating layer 111 may be formed on the carrier adhesive layer 901. The first insulating layer 111 may cover the lower seed patterns 151 and the under bump patterns 150. The first insulating layer 111 may be formed by a coating process such as a spin coating process or a slit coating process. The first insulating layer 111 may be patterned to form a plurality of first holes 111T in the first insulating layer 111. The patterning of the first insulating layer 111 may be performed by an exposure process and a development process. Each of the first holes 111T may expose a portion of a top surface of each of the under bump patterns 150. For example, each of the first holes 111T may have a tapered shape.

Figure 4:
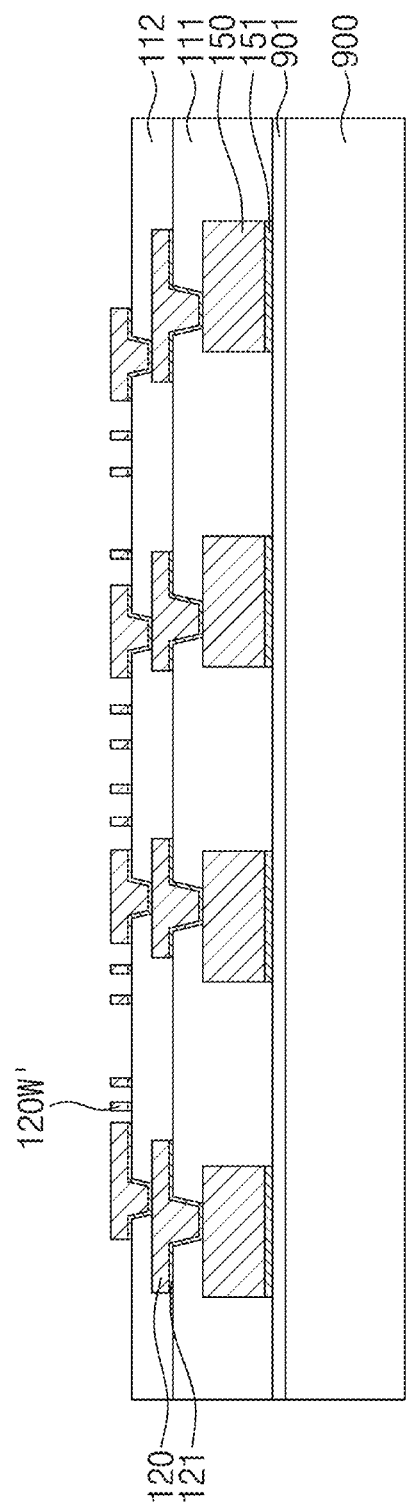

Referring to FIG. 4, a plurality of first seed patterns 121 may be formed on the first insulating layer 111. Each of some of the first seed patterns 121 may be formed to conformally cover a portion of a top surface of the first insulating layer 111, an inner sidewall of the first hole 111T, and a bottom surface of the first hole 111T. Each of the others of the first seed patterns 121 may be formed to conformally cover a portion of the top surface of the first insulating layer 111. The first seed patterns 121 may be formed by a deposition process and an etching process. A plurality of first redistribution patterns 120 and a plurality of first fine patterns 120W' may be formed on the first seed patterns 121. Each of the first redistribution patterns 120 may fill a remaining portion of each of the first holes 111T and may cover a top surface of each of the some of the first seed patterns 121. Each of the first fine patterns 120W' may cover a top surface of each of the others of the first seed patterns 121. The first redistribution patterns 120 and the first fine patterns 120W' may be formed by an electroplating process using the first seed patterns 121 as electrodes and an etching process. A top surface of each of the first redistribution patterns 120 may be substantially flat by the electroplating process. In other words, a dimple structure may not be formed in the top surface of the first redistribution pattern 120.

A second insulating layer 112 may be formed on the first insulating layer 111. The second insulating layer 112 may cover the first insulating layer 111 and the first redistribution patterns 120. The second insulating layer 112 may be formed by a coating process such as a spin coating process or a slit coating process. First holes may be formed in the second insulating layer 112, and then, a plurality of first seed patterns 121 and a plurality of first redistribution patterns 120 may be sequentially formed. The first seed patterns 121 and the first redistribution patterns 120 of the second insulating layer 112 may be formed by the same method as described above.

Figure 5:
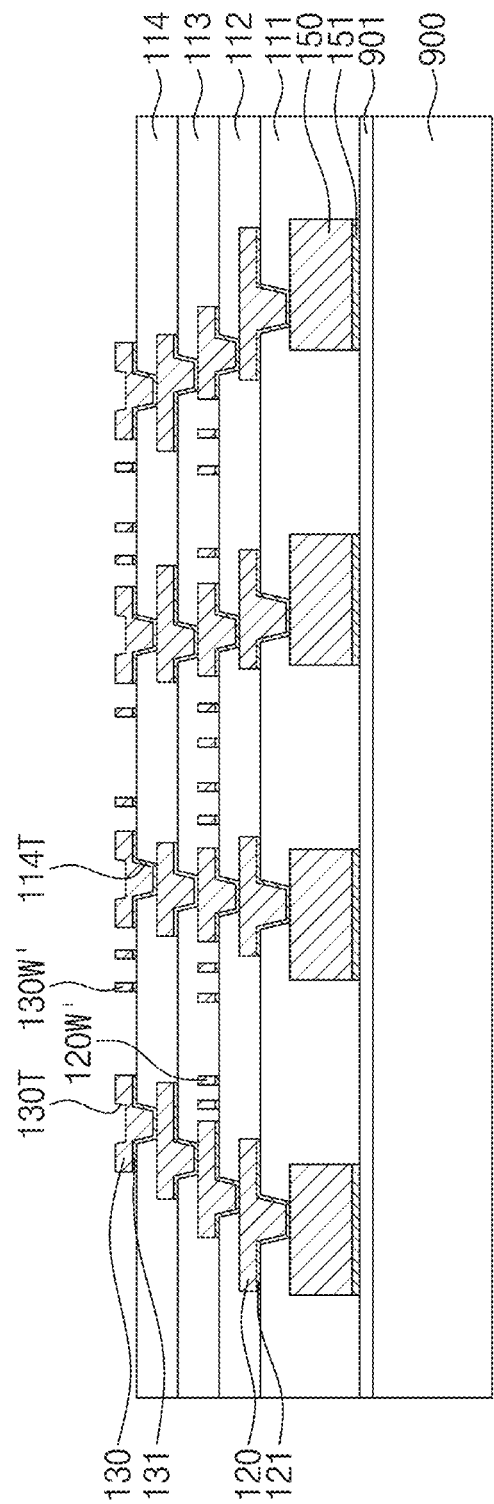

Referring to FIG. 5, the processes may be repeated to form a third insulating layer 113 on the second insulating layer 112 and to sequentially form a plurality of first seed patterns 121 and a plurality of first redistribution patterns 120. Likewise, the process may be repeated to form a fourth insulating layer 114 on the third insulating layer 113. The fourth insulating layer 114 may be formed by a coating process such as a spin coating process or a slit coating process. The fourth insulating layer 114 may be patterned to form a plurality of second holes 114T in the fourth insulating layer 114. The patterning of the fourth insulating layer 114 may be performed by an exposure process and a development process. Each of the second holes 114T may expose a portion of a top surface of an uppermost one of the first redistribution patterns 120. For example, each of the second holes 114T may have a tapered shape.

A plurality of second seed patterns 131 may be formed on a top surface of the fourth insulating layer 114. Each of some of the second seed patterns 131 may be formed to conformally cover a portion of the top surface of the fourth insulating layer 114, an inner sidewall of the second hole 114T, and a bottom surface of the second hole 114T. Each of the others of the second seed patterns 131 may be formed to conformally cover a portion of the top surface of the fourth insulating layer 114. The second seed patterns 131 may be formed by a deposition process and an etching process. A plurality of second redistribution patterns 130 and a plurality of second fine patterns 130W' may be formed on the second seed patterns 131. Each of the second redistribution patterns 130 may fill a remaining portion of each of the second holes 114T and may cover a top surface of each of the some of the second seed patterns 131. Each of the second fine patterns 130W' may cover a top surface of each of the others of the second seed patterns 131. The second redistribution patterns 130 and the second fine patterns 130W' may be formed by an electroplating process using the second seed patterns 131 as electrodes and an etching process. A recess region 130T may be formed in a top surface of each of the second redistribution patterns 130 by the electroplating process. In other words, a dimple structure may be formed in the top surface of the second redistribution pattern 130. A process condition (e.g., a plating solution and/or a current density) of the electroplating process of forming the dimple structure in the top surface of the second redistribution pattern 130 may be different from that of the electroplating process of forming the first redistribution pattern 120 having the substantially flat top surface. In other words, according to the embodiments of the inventive concepts, the dimple structure may be selectively formed in the top surface of the second redistribution pattern 130 by adjusting the process condition of the electroplating process, without an additional process. Thus, according to the embodiments of the inventive concepts, the method for manufacturing a semiconductor package, which is capable of reducing a manufacturing cost, may be provided.

Figure 6:
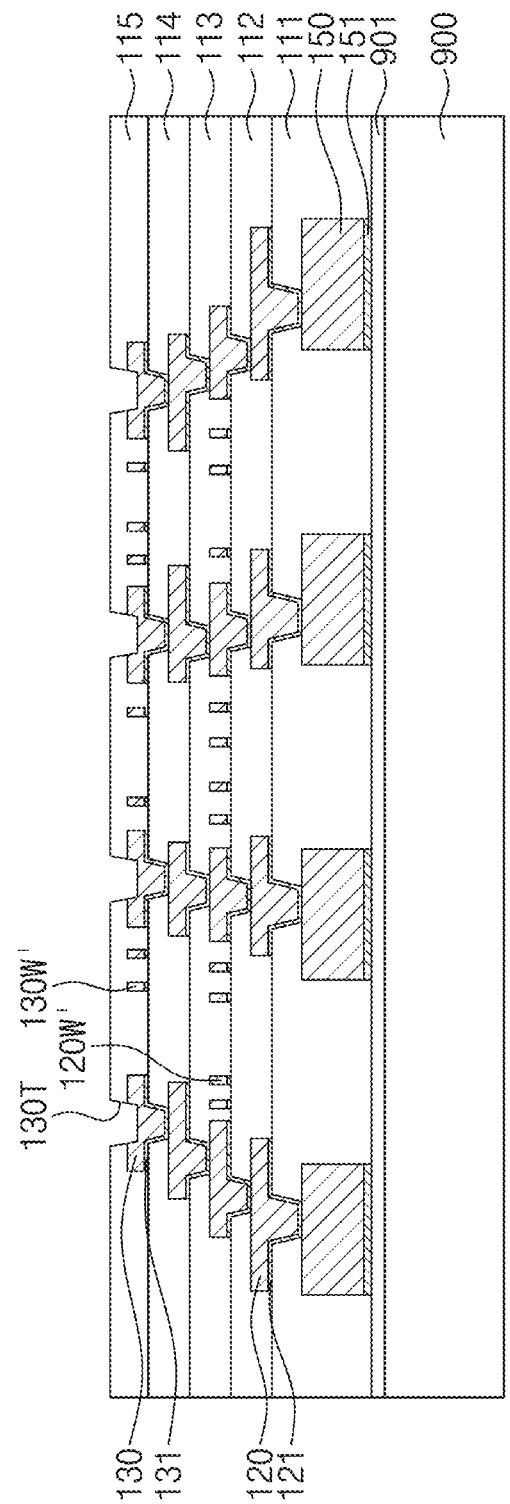

Referring to FIG. 6, a fifth insulating layer 115 may be formed on the fourth insulating layer 114. The fifth insulating layer 115 may cover the fourth insulating layer 114 and the second redistribution patterns 130. The fifth insulating layer 115 may be formed by a coating process such as a spin coating process or a slit coating process. The fifth insulating layer 115 may be patterned along an inner sidewall of the recess region 130T to expose a bottom surface of the recess region 130T. The patterning of the fifth insulating layer 115 may be performed by an exposure process and a development process. For example, each of the recess regions 130T may have a tapered shape.

Figure 7:
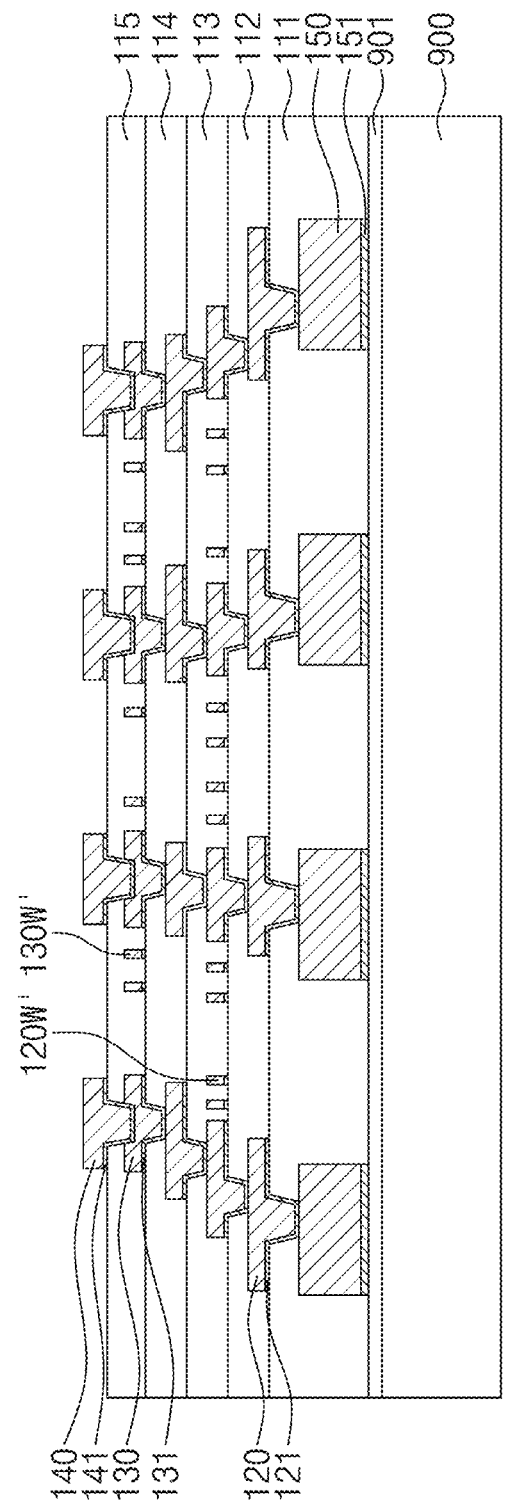

Referring to FIG. 7, pad seed patterns 141 may be formed on the fifth insulating layer 115 and in the recess regions 130T. Each of the pad seed patterns 141 may be formed to conformally cover both inner sidewalls and the bottom surface of each of the recess regions 130T and may extend from the both inner sidewalls of the recess region 130T to conformally cover portions of the top surface of the fifth insulating layer 115. The pad seed patterns 141 may be formed by a deposition process and an etching process. A plurality of pad patterns 140 may be formed on the pad seed patterns 141. Each of the pad patterns 140 may fill a remaining portion of each of the recess regions 130T and may cover a top surface of each of the pad seed patterns 141. The pad patterns 140 may be formed by an electroplating process using the pad seed patterns 141 as electrodes and an etching process. A top surface of each of the pad patterns 140 may be substantially flat by the electroplating process. In other words, a dimple structure may not be formed in top surfaces of the pad patterns 140.

Figure 8:
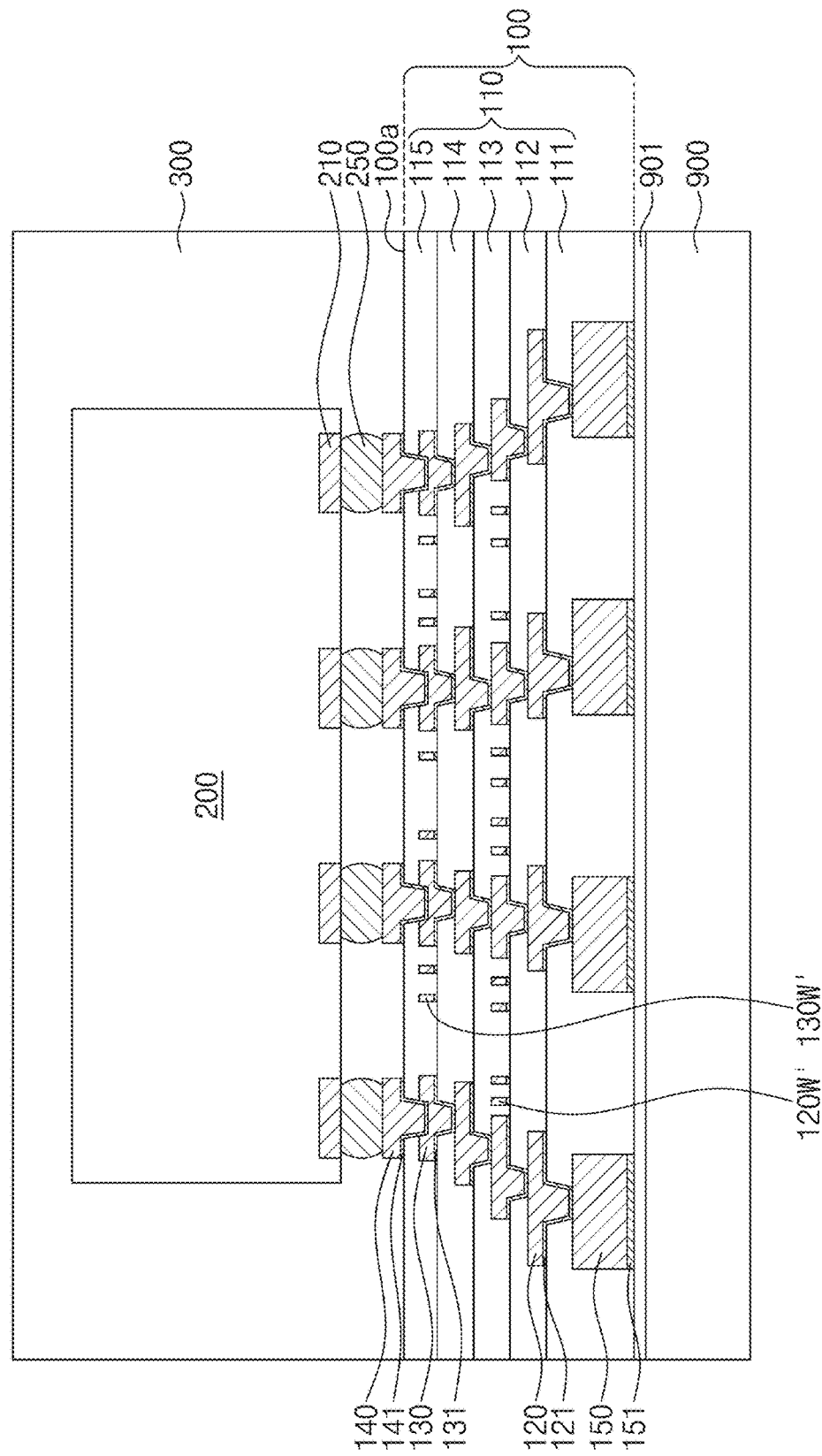

Referring to FIG. 8, a semiconductor chip 200 including a plurality of chip pads 210 may be mounted on the redistribution substrate 100. The semiconductor chip 200 may be disposed in such a way that the chip pads 210 are aligned with the pad patterns 140, respectively. Connection terminals 250 may be formed between the semiconductor chip 200 and the redistribution substrate 100. The connection terminals 250 may be electrically connected to the chip pads 210 and the pad patterns 140.

A molding layer 300 may be formed on the fifth insulating layer 115 to cover the top surface of the fifth insulating layer 115 and the semiconductor chip 200. The molding layer 300 may seal or encapsulate the semiconductor chip 200 and the connection terminals 250.

Referring again to FIG. 1, the carrier substrate 900 and the carrier adhesive layer 901 may be removed to expose a bottom surface of the first insulating layer 111 and bottom surfaces of the lower seed patterns 151. The lower seed patterns 151 may be removed to expose bottom surfaces of the under bump patterns 150. The removal of the lower seed patterns 151 may be performed by an etching process. Since the lower seed patterns 151 are removed, the bottom surfaces of the under bump patterns 150 may be located at a higher level than the bottom surface 100b of the insulating layer 110.

External terminals 400 may be formed on the bottom surfaces of the under bump patterns 150. The formation of the external terminals 400 may include performing a process of attaching a solder ball.

In the above descriptions, a single semiconductor package 10 was described and illustrated for the purpose of ease and convenience in explanation. However, example embodiments of the inventive concepts are not limited to the manufacture of the semiconductor package 10 in a chip level. For example, the semiconductor package 10 may be manufactured in a chip level, a panel level, or a wafer level.

Figure 9:
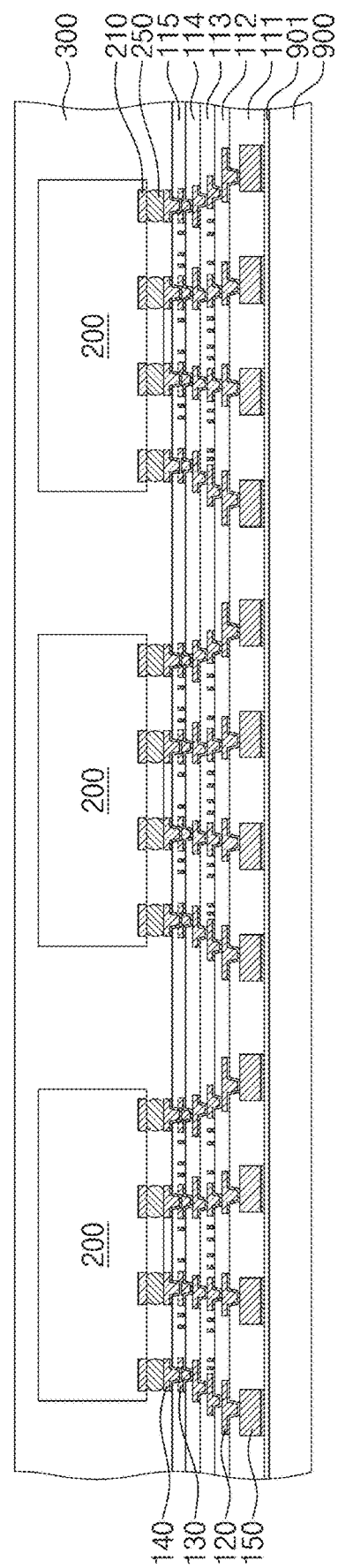
FIGS. 9 and 10 are cross-sectional views illustrating a method for manufacturing a semiconductor package according to some example embodiments of the inventive concepts.
Figure 10:
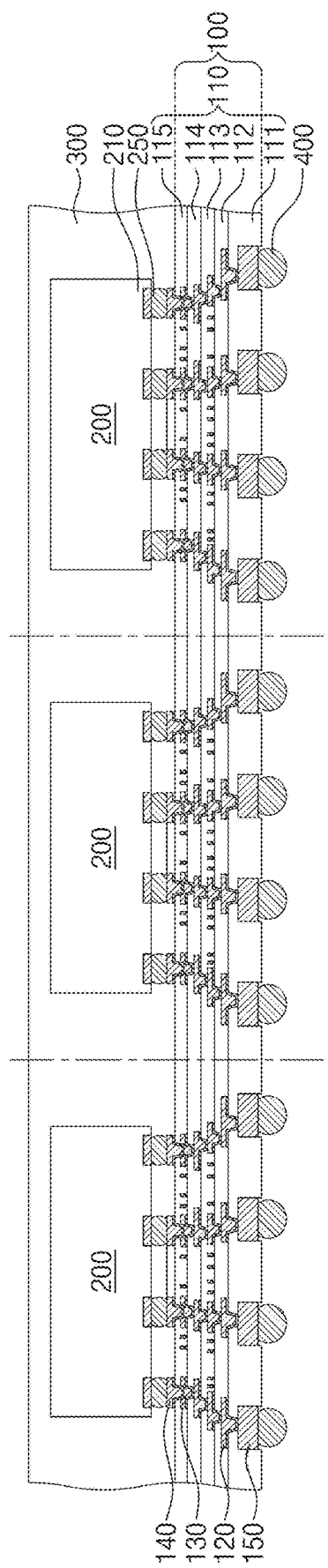

FIGS. 9 and 10 are cross-sectional views illustrating a method for manufacturing a semiconductor package according to some example embodiments of the inventive concepts. Hereinafter, the descriptions to the same features as in the above embodiments will be omitted for the purpose of ease and convenience in explanation.

Referring to FIG. 9, a redistribution substrate 100 may be formed on a carrier substrate 900. The redistribution substrate 100 may include first redistribution patterns 120, second redistribution patterns 130, an insulating layer 110, and under bump patterns 150. The insulating layer 110 may include first to fifth insulating layers 111, 112, 113, 114 and 115 which are sequentially stacked. Formation of the insulating layer 110, the under bump patterns 150, the first redistribution patterns 120, the second redistribution patterns 130 and the pad patterns 140 may be substantially the same as described above with reference to FIGS. 1 and 3 to 8. A semiconductor chip 200 may be provided on the redistribution substrate 100 in such a way that chip pads 210 of the semiconductor chip 200 face the redistribution substrate 100. Connection terminals 250 may be formed between the pad patterns 140 and the chip pads 210. At this time, the semiconductor chip 200 may be provided in plurality. The formation of the connection terminals 250 and the molding layer 300 may be substantially the same as described above with reference to FIGS. 1 and 3 to 8.

Referring to FIG. 10, the carrier substrate 900 and the carrier adhesive layer 901 may be removed to expose a bottom surface of the first insulating layer 111 and bottom surfaces of the lower seed patterns 151. The lower seed patterns 151 may be removed to expose bottom surfaces of the under bump patterns 150. External terminals 400 may be formed on the bottom surfaces of the under bump patterns 150. The formation of the external terminals 400 may be substantially the same as described above with reference to FIGS. 1 and 3 to 8.

The molding layer 300 and the redistribution substrate 100 may be sawed along one-dot chain lines to separate semiconductor packages 10 from each other. In the present specification, the semiconductor packages 10 may be manufactured in a chip level, a panel level, or a wafer level. Hereinafter, a single semiconductor package will be described and illustrated for the purpose of ease and convenience in explanation. However, example embodiments of the inventive concepts are not limited to the manufacture of a semiconductor package in a chip level.

Figure 11:
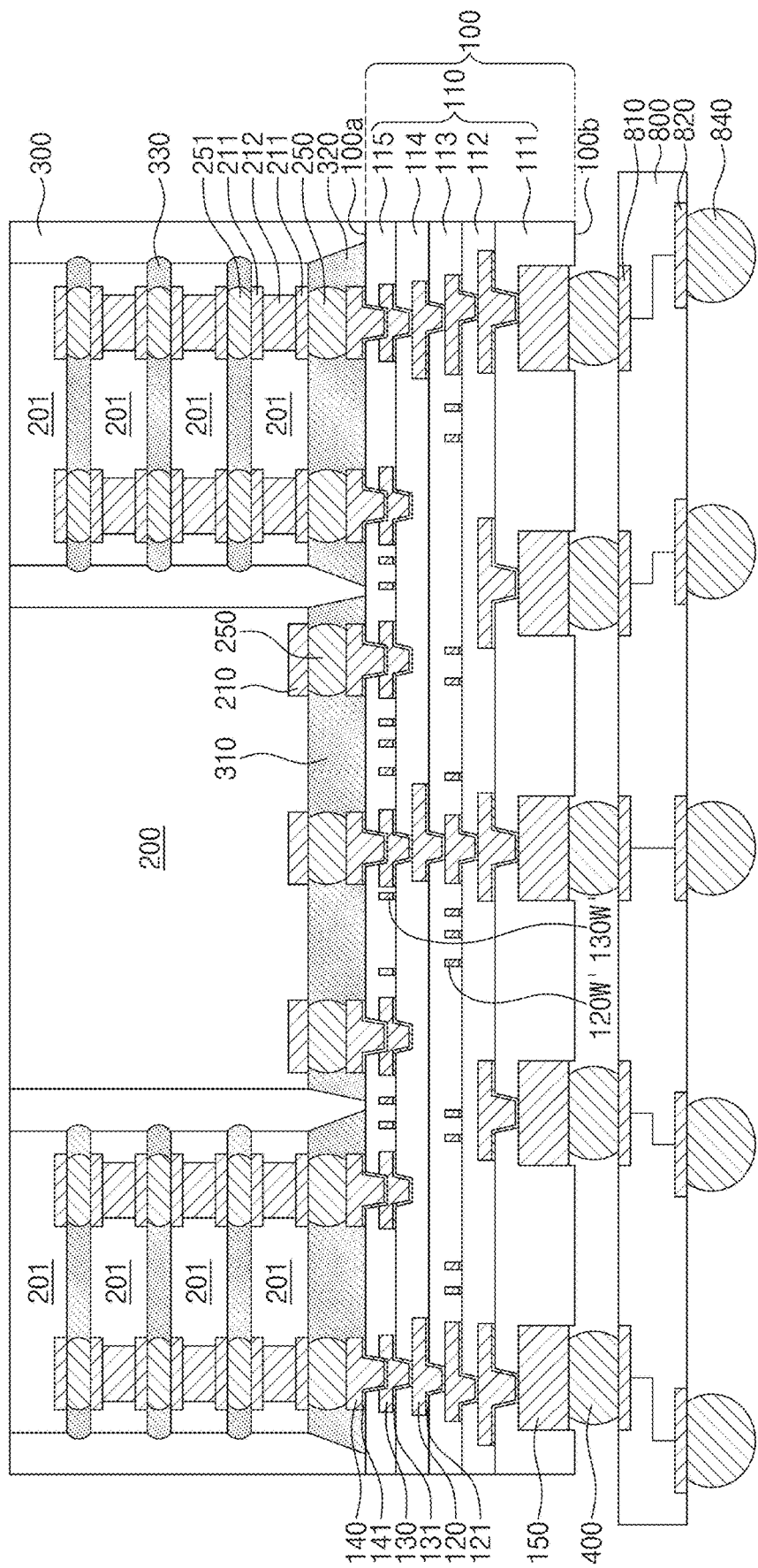
FIG. 11 is a cross-sectional view illustrating a semiconductor package according to some example embodiments of the inventive concepts.

FIG. 11 is a cross-sectional view illustrating a semiconductor package according to some example embodiments of the inventive concepts. Hereinafter, the descriptions to the same components and/or features as in the above example embodiments will be omitted for the purpose of ease and convenience in explanation.

Referring to FIG. 11, a semiconductor package 20 may include a package substrate 800, a redistribution substrate 100, an external terminal 400, a semiconductor chip 200, a plurality of chips 201, and a molding layer 300. The external terminal 400 and the molding layer 300 may be substantially the same as described above with reference to FIGS. 1 and 2.

The package substrate 800 may include a printed circuit board (PCB). The package substrate 800 may include a substrate interconnection 820 and a substrate pad 810. The substrate interconnection 820 may be provided in the package substrate 800. The substrate pad 810 may be provided on a top surface of the package substrate 800 and may be electrically connected to the substrate interconnection 820. Lower terminals 840 may be provided on a bottom surface of the package substrate 800 and may be connected to the substrate interconnections 820, respectively. External electrical signals may be transmitted to the substrate interconnections 820 through the lower terminals 840. The lower terminals 840 may include at least one of a solder, a pillar, or a bump. The lower terminals 840 may include a conductive metal material and may include at least one metal of, for example, tin (Sn), lead (Pb), nickel (Ni), gold (Au), silver (Ag), copper (Cu), aluminum (Al), or bismuth (Bi).

The redistribution substrate 100 may be disposed on the package substrate 800. The redistribution substrate 100 may function as an interposer substrate. The external terminal 400 may be aligned with the substrate pad 810 of the package substrate 800 and may be connected to the substrate pad 810. The redistribution substrate 100 may be electrically connected to the package substrate 800 through the external terminal 400. The redistribution substrate 100 may be substantially the same as described with reference to FIGS. 1 and 2.

The semiconductor chip 200 may be mounted on the top surface 100a of the redistribution substrate 100. A connection terminal 250 may be provided between a chip pad 210 and a pad pattern 140. The connection terminal 250 may be disposed between the semiconductor chip 200 and the redistribution substrate 100 and may be connected to the chip pad 210 and the pad pattern 140. The semiconductor chip 200 may be substantially the same as described above with reference to FIGS. 1 and 2, and the connection terminal 250 may be substantially the same as described above with reference to FIGS. 1 and 2.

A first underfill pattern 310 may be provided in a gap region between the redistribution substrate 100 and the semiconductor chip 200. The first underfill pattern 310 may seal or surround the connection terminal 250 between the chip pad 210 and the pad pattern 140. The first underfill pattern 310 may include an insulating polymer such as an epoxy-based polymer.

The plurality of chips 201 may be mounted on the top surface 100a of the redistribution substrate 100. The chips 201 may be laterally spaced apart from the semiconductor chip 200. The plurality of chips 201 may be vertically stacked to form a chip stack. The chip stack may be provided in plurality, and the plurality of chip stacks may be laterally spaced apart from the semiconductor chip 200. The semiconductor chip 200 may be disposed between the chip stacks. Each of the chips 201 may be a semiconductor chip, and a kind of each of the chips 201 may be the same as or different from that of the semiconductor chip 200. For example, the semiconductor chip 200 may be one of a logic chip, a buffer chip, and a system-on-chip (SOC), and each of the plurality of chips 201 may be another of a logic chip, a memory chip, a buffer chip, and a system-on-chip (SOC). In the present specification, the memory chip may include a high bandwidth memory (HBM) chip. In some example embodiments, the semiconductor chip 200 may be a logic chip, and the plurality of chips 201 may be the HBM chips.

In certain embodiments, a lowermost one of the plurality of chips 201 may be a logic chip, and the others of the plurality of chips 201 may be the HBM chips.

Each of the chips 201 may include a conductive pad 211 and a through-electrode 212. The conductive pad 211 may be provided on each of bottom and top surfaces of each of the plurality of chips 201. However, the conductive pad 211 may not be provided on the top surface of an uppermost one of the plurality of chips 201. At least one of the conductive pads 211 may be electrically connected to integrated circuits of each of the plurality of chips 201. The through-electrode 212 may be disposed in each of the chips 201 and may be connected to the conductive pads 211. The through-electrode 212 may not be provided in the uppermost one of the plurality of chips 201. However, unlike FIG. 11, the uppermost one of the plurality of chips 201 may further include the conductive pad 211 provided on its top surface and the through-electrode 212 provided therein. A chip terminal 251 may be disposed between the chips 201 adjacent to each other and may be connected to the conductive pads 211. Thus, the plurality of chips 201 may be electrically connected to each other. The chip terminal 251 may include at least one of a solder, a pillar, or a bump. The chip terminal 251 may include a conductive metal material and may include at least one metal of, for example, tin (Sn), lead (Pb), nickel (Ni), gold (Au), silver (Ag), copper (Cu), aluminum (Al), or bismuth (Bi). However, unlike FIG. 11, the chip terminal 251 may be omitted. In this case, facing conductive pads 211 of the adjacent chips 201 may be bonded directly to each other.

A connection terminal 250 may be provided between the pad pattern 140 and the conductive pad 211 provided on the bottom surface of a lowermost one of the plurality of chips 201. The connection terminal 250 may be disposed between the lowermost chip 201 and the redistribution substrate 100 and may be connected to the conductive pad 211 and the pad pattern 140. The connection terminal 250 may be substantially the same as described above with reference to FIGS. 1 and 2. Thus, the chips 201 may be electrically connected to the semiconductor chip 200 and the external terminal 400 through the redistribution substrate 100.

A second underfill pattern 320 may be provided in a gap region between the redistribution substrate 100 and the lowermost one of the plurality of chips 201. The second underfill pattern 320 may seal or surround the connection terminal 250 between the conductive pad 211 and the pad pattern 140. The second underfill pattern 320 may include an insulating polymer such as an epoxy-based polymer.

A third underfill pattern 330 may be provided between the chips 201 to seal or surround the chip terminal 251. The third underfill pattern 330 may include an insulating polymer such as an epoxy-based polymer.

The molding layer 300 may be disposed on the redistribution substrate 100 to cover a sidewall of the semiconductor chip 200 and sidewalls of the chips 201. The molding layer 300 may expose a top surface of the semiconductor chip 200 and the top surface of the uppermost one of the plurality of chips 201. Alternatively, unlike FIG. 11, the molding layer 300 may cover the top surface of the semiconductor chip 200 and the top surface of the uppermost one of the plurality of chips 201. Unlike FIG. 11, the first and second underfill patterns 310 and 320 may be omitted, and the molding layer 300 may fill the gap region between the redistribution substrate 100 and the semiconductor chip 200 and the gap region between the redistribution substrate 100 and the lowermost one of the plurality of chips 201.

Figure 12:
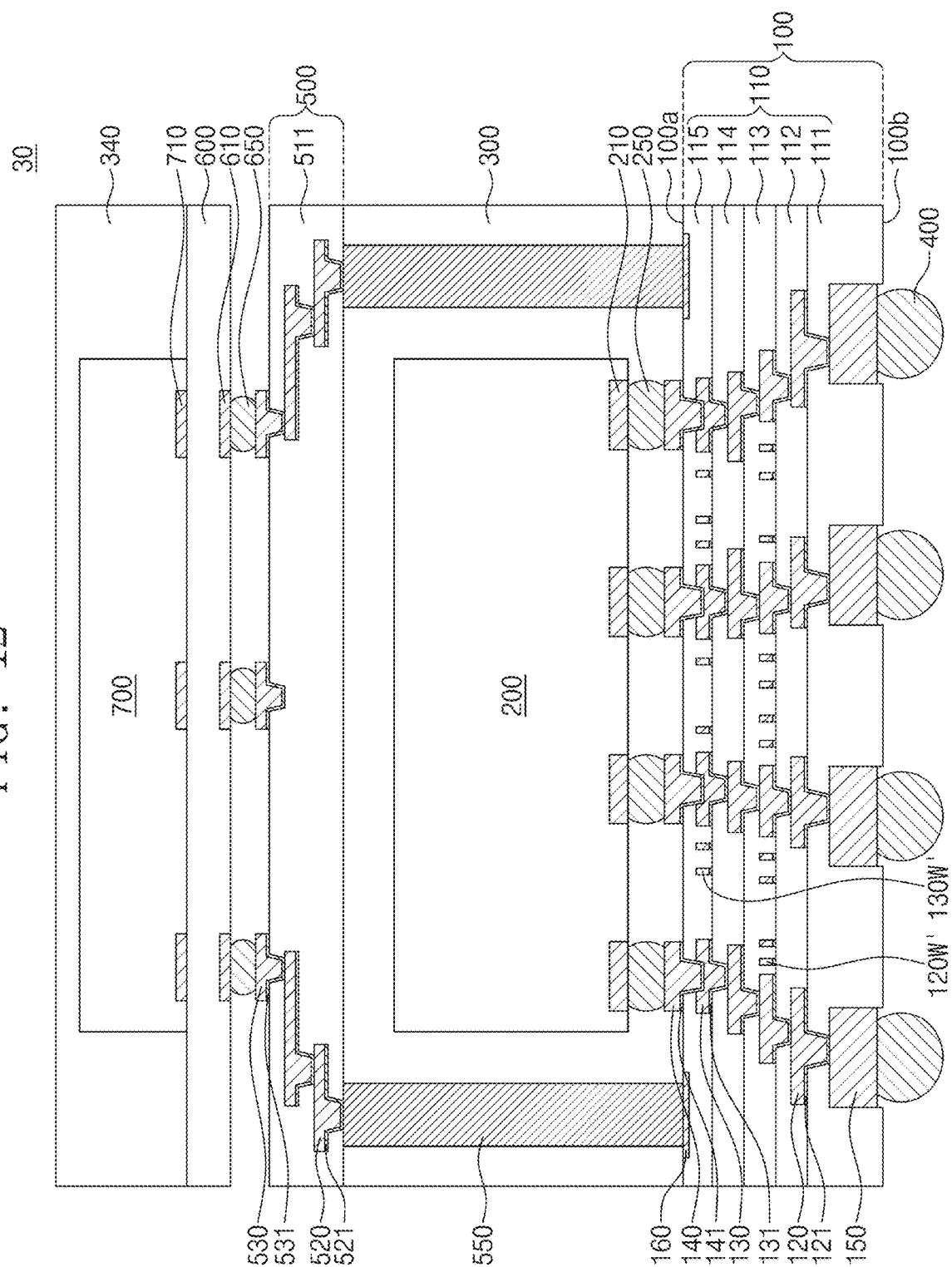
FIG. 12 is a cross-sectional view illustrating a semiconductor package according to some example embodiments of the inventive concepts.

FIG. 12 is a cross-sectional view illustrating a semiconductor package according to some example embodiments of the inventive concepts. Hereinafter, the descriptions to the same components and/or features as in the above embodiments will be omitted for the purpose of ease and convenience in explanation.

Referring to FIG. 12, a semiconductor package 30 may include a redistribution substrate 100, a semiconductor chip 200, a molding layer 300 and an external terminal 400 and may further include an upper redistribution layer 500, a conductive structure 550, a conductive pattern 160, an upper substrate 600, an upper semiconductor chip 700, an upper terminal 650 and an upper molding layer 340.

The conductive pattern 160 may be provided on a top surface 100a of the redistribution substrate 100. The conductive pattern 160 may include a conductive metal material, for example, copper (Cu). The redistribution substrate 100, the semiconductor chip 200, the molding layer 300 and the external terminal 400 may be substantially the same as described above with reference to FIGS. 1 and 2 and may be formed by substantially the same method as described above with reference to FIGS. 3 to 8.

The conductive structure 550 may be provided on the top surface 100a of the redistribution substrate 100 so as to be connected to the conductive pattern 160. The conductive structure 550 may be spaced apart from the semiconductor chip 200. The conductive structure 550 may be electrically connected to the redistribution substrate 100. Thus, the conductive structure 550 may be electrically connected to the semiconductor chip 200 or the external terminal 400 through the redistribution substrate 100. For example, the conductive structure 550 may be a metal pillar. The conductive structure 550 may include a conductive metal material, for example, copper (Cu), aluminum (Al), gold (Au), lead (Pb), stainless steel (SUS), silver (Ag), iron (Fe), and/or any alloy thereof.

The molding layer 300 may be formed on the redistribution substrate 100 to cover the top surface of the insulating layer 110, a sidewall of the conductive structure 550, and the semiconductor chip 200. The molding layer 300 may fill a space between the semiconductor chip 200 and the conductive structure 550.

The upper redistribution layer 500 may be provided on a top surface of the conductive structure 550 and the molding layer 300. The upper redistribution layer 500 may include an upper insulating layer 511, upper redistribution patterns 520, an upper seed layer 521, an upper pad pattern 530, and an upper pad seed layer 531. The upper insulating layer 511 may include a photosensitive polymer. The upper insulating layer 511 may be formed by substantially the same method as the method of forming the insulating layer 110. The upper redistribution patterns 520 and the upper pad pattern 530 may include a metal such as copper. The upper redistribution patterns 520 may be formed by substantially the same method as the method of forming the first redistribution patterns 120. The upper seed layer 521 may be formed by substantially the same method as the method of forming the first seed pattern 121. The upper pad pattern 530 may be formed by substantially the same method as the method of forming the pad pattern 140. The upper pad seed layer 531 may be formed by substantially the same method as the method of forming the pad seed pattern 141. At least one of the upper redistribution patterns 520 may be connected to the conductive structure 550. The upper redistribution patterns 520 may be electrically connected to the upper pad pattern 530. Thus, the upper pad pattern 530 may be electrically connected to the external terminal 400 and/or the semiconductor chip 200 through the upper redistribution patterns 520 and the conductive structure 550.

The upper substrate 600 may be provided on the upper redistribution layer 500. The upper substrate 600 may be a printed circuit board or a redistribution substrate. An upper pad 610 may be disposed on a bottom surface of the upper substrate 600. The upper semiconductor chip 700 may be mounted on the upper substrate 600. For example, the upper semiconductor chip 700 may be a memory chip, a logic chip, or a sensing chip. However, example embodiments of the inventive concepts are not limited thereto. The upper semiconductor chip 700 may include upper chip pads 710 in its lower portion.

The upper terminal 650 may be provided on the bottom surface of the upper substrate 600. The upper terminal 650 may be provided between the upper redistribution layer 500 and the upper substrate 600. The upper terminal 650 may be provided in plurality. Each of the upper terminals 650 may be provided between the upper pad pattern 530 and the upper pad 610 and may be electrically connected to the upper pad pattern 530 and the upper pad 610. In other words, the upper semiconductor chip 700 may be electrically connected to the external terminal 400 through the upper terminals 650. The upper terminal 650 may include at least one of a solder, a pillar, or a bump. The upper terminal 650 may include a conductive metal material and may include at least one metal of, for example, tin (Sn), lead (Pb), nickel (Ni), gold (Au), silver (Ag), copper (Cu), aluminum (Al), or bismuth (Bi).

The upper molding layer 340 may be provided on the upper substrate 600 to cover the upper semiconductor chip 700. The upper molding layer 340 may include an insulating polymer such as an epoxy molding compound (EMC).

Figure 13:
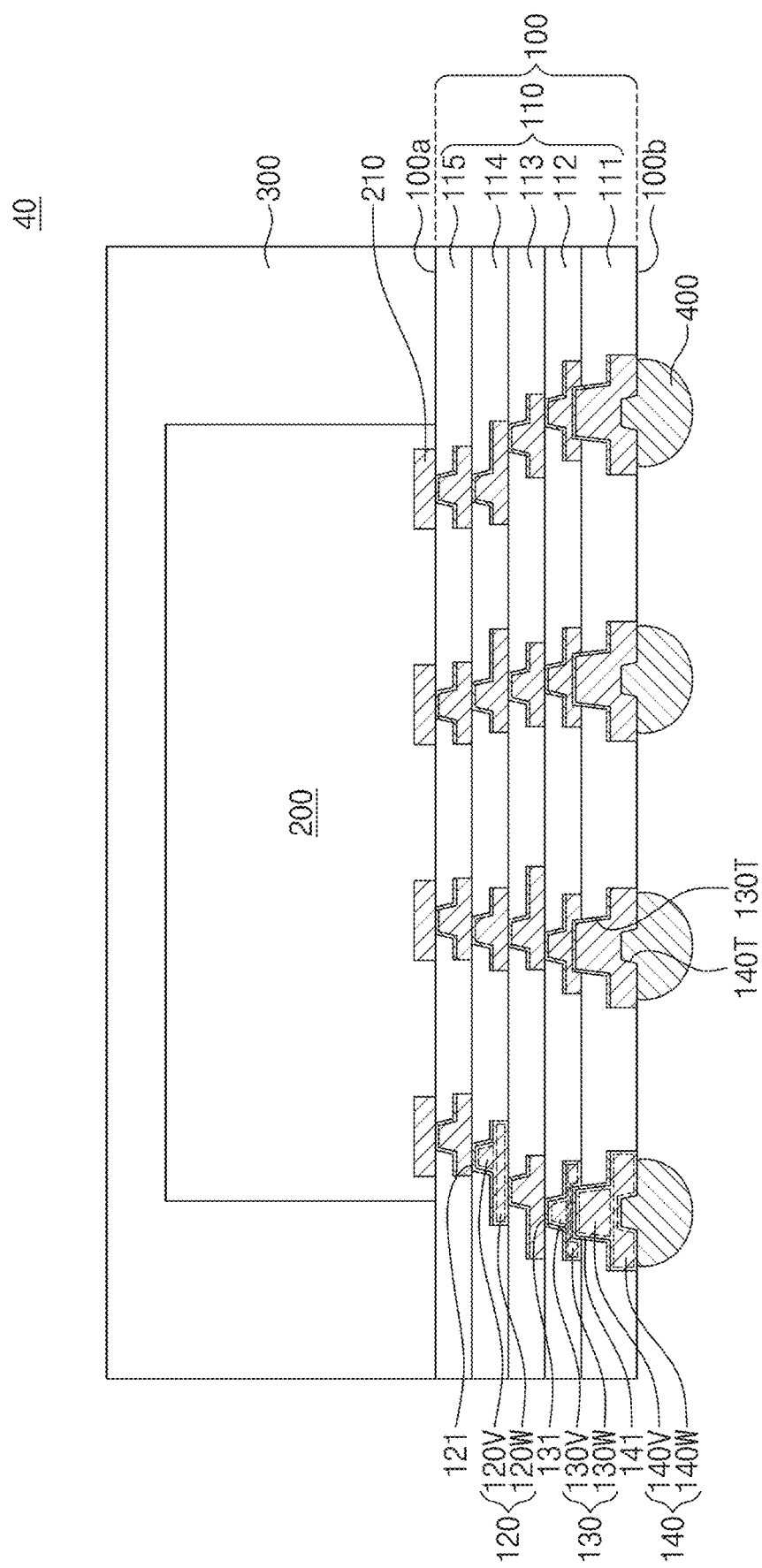
FIG. 13 is a cross-sectional view illustrating a semiconductor package according to some example embodiments of the inventive concepts.

FIG. 13 is a cross-sectional view illustrating a semiconductor package according to some example embodiments of the inventive concepts. Hereinafter, the descriptions to the same components and/or features as in the above embodiments will be omitted for the purpose of ease and convenience in explanation.

Referring to FIG. 13, a semiconductor package 40 may include a redistribution substrate 100 including an insulating layer 110, a first redistribution pattern 120, a second redistribution pattern 130 and a pad pattern 140; a semiconductor chip 200 provided on a top surface 100a of the redistribution substrate 100; a connection terminal 250 provided between the redistribution substrate 100 and the semiconductor chip 200; and an external terminal 400 provided on a bottom surface 100b of the redistribution substrate 100.

The redistribution substrate 100 may include the pad pattern 140 on the external terminal 400, the first redistribution pattern 120 on the pad pattern 140, the second redistribution pattern 130 disposed between the pad pattern 140 and the first redistribution pattern 120, and the insulating layer 110 covering the first redistribution pattern 120 and the second redistribution pattern 130. The redistribution substrate 100 may be a wafer-level substrate or a panel-level substrate.

The insulating layer 110 may cover the first redistribution pattern 120, the second redistribution pattern 130, and the pad pattern 140. The insulating layer 110 may include first to fifth insulating layers 111, 112, 113, 114 and 115 which are sequentially stacked. The first to fifth insulating layers 111, 112, 113, 114 and 115 may include an organic material such as a photosensitive polymer. For example, the photosensitive polymer may include at least one of photosensitive polyimide, polybenzoxazole, a phenol-based polymer, or a benzocyclobutene-based polymer. In some example embodiments, the insulating layer 110 may include, but not limited to, a photo imageable dielectric (PID).

The external terminal 400 may be provided on the bottom surface 100b of the redistribution substrate 100. The external terminal 400 may be provided in plurality. The external terminal 400 may include at least one of a solder, a pillar, or a bump. The external terminal 400 may be connected to an external device (not shown).

The pad pattern 140 may be provided in the first insulating layer 111. The pad pattern 140 may be provided in plurality, and the plurality of pad patterns 140 may be spaced apart from each other in the direction parallel to the top surface 100a of the redistribution substrate 100. Each of the pad patterns 140 may be provided on a top surface of a corresponding one of the external terminals 400. The pad pattern 140 may be in contact with the external terminal 400. The first insulating layer 111 may expose a bottom surface of the pad pattern 140. The pad pattern 140 may include a conductive metal material, for example, copper (Cu).

Each of the pad patterns 140 may include a pad via 140V and a pad 140W. The pad via 140V may be provided on the pad 140W. The pad 140W may be disposed in the first insulating layer 111. The pad 140W may have a long axis extending in the direction parallel to the top surface 100a of the redistribution substrate 100. A width of the pad 140W may be greater than a width of the pad via 140V. A portion of a bottom surface of the pad 140W may be recessed, and thus the pad 140W may include an opening 140T recessed toward the pad via 140V. For example, the opening 140T may have a tapered shape of which a width becomes less toward its top. In other words, a dimple structure which is concave toward the top surface 100a of the redistribution substrate 100 may be formed in the bottom surface of the pad 140W. A bottom surface of the opening 140T may be located at a higher level than a bottommost surface of the pad 140W. The pad 140W may function as a pad of the external terminal 400. The pad via 140V may have a shape protruding from the pad 140W toward the top surface 100a of the redistribution substrate 100. A top width of the pad via 140V may be less than a bottom width of the pad via 140V.

A pad seed pattern 141 may be provided on the pad pattern 140. The pad seed pattern 141 may be conformally formed on the pad pattern 140. The pad seed pattern 141 may be disposed between the pad pattern 140 and the first insulating layer 111 and between the pad pattern 140 and the second redistribution pattern 130.

The second redistribution pattern 130 may be provided on the first insulating layer 111 and the pad seed pattern 141. The second redistribution pattern 130 may be provided in plurality, and the plurality of second redistribution patterns 130 may be spaced apart from each other in the direction parallel to the top surface 100a of the redistribution substrate 100. Each of the second redistribution patterns 130 may include a second via 130V and a second interconnection 130W. The second via 130V may be disposed on the second interconnection 130W. The second interconnection 130W may be disposed in the second insulating layer 112. The second interconnection 130W may have a long axis extending in the direction parallel to the top surface 100a of the redistribution substrate 100. A width of the second interconnection 130W may be greater than a width of the second via 130V. A portion of a bottom surface of the second interconnection 130W may be recessed, and thus the second interconnection 130W may include a recess region 130T recessed toward the second via 130V. For example, the recess region 130T may have a tapered shape of which a width becomes less toward its top. In other words, a dimple structure which is concave toward the top surface 100a of the redistribution substrate 100 may be formed in the bottom surface of the second interconnection 130W. A bottom surface of the recess region 130T may be located at a higher level than a bottommost surface of the second interconnection 130W. The second via 130V may have a shape protruding from the second interconnection 130W toward the top surface 100a of the redistribution substrate 100. A top width of the second via 130V may be less than a bottom width of the second via 130V.

A second seed pattern 131 may be provided on the second redistribution pattern 130. The second seed pattern 131 may be conformally formed on the second redistribution pattern 130. The second seed pattern 131 may be disposed between the second redistribution pattern 130 and the second insulating layer 112 and between the second redistribution pattern 130 and the first redistribution pattern 120.

The first redistribution pattern 120 may be provided in the insulating layer 110. The first redistribution pattern 120 may be provided in plurality, and the plurality of first redistribution patterns 120 may be spaced apart from each other in the direction parallel to the top surface 100a of the redistribution substrate 100. In addition, a plurality of the first redistribution patterns 120 may be stacked in the direction perpendicular to the top surface 100a of the redistribution substrate 100. Each of the first redistribution patterns 120 may include a first via 120V and a first interconnection 120W. The first via 120V may be disposed on the first interconnection 120W. The first interconnection 120W may have a long axis extending in the direction parallel to the top surface 100a of the redistribution substrate 100. A width of the first interconnection 120W may be greater than a width of the first via 120V. The first via 120V may have a shape protruding from the first interconnection 120W toward the top surface 100a of the redistribution substrate 100. A top width of the first via 120V may be less than a bottom width of the first via 120V.

A first seed pattern 121 may be provided on the first redistribution pattern 120. The first seed pattern 121 may be conformally formed on the first redistribution pattern 120. The first seed pattern 121 may be disposed between the first redistribution pattern 120 and the insulating layer 110. Particularly, the first seed pattern 121 may be disposed between the first redistribution pattern 120 and the insulating layer 110 and between the first redistribution pattern 120 and the first redistribution pattern 120 disposed thereon. An uppermost one of the first seed patterns 121 may be disposed between the first redistribution pattern 120 and the insulating layer 110 and between the first redistribution pattern 120 and a chip pad 210.

The semiconductor chip 200 may be mounted on the top surface 100a of the redistribution substrate 100. The semiconductor chip 200 may include a chip pad 210 provided in a lower portion of the semiconductor chip 200. The chip pad 210 may be provided in plurality, and the plurality of chip pads 210 may be spaced apart from each other in the direction parallel to the top surface 100a of the redistribution substrate 100. The chip pad 210 may be electrically connected to an uppermost one of the first redistribution patterns 120. The chip pad 210 may be electrically connected to integrated circuits of the semiconductor chip 200 through interconnection lines. The semiconductor chip 200 may be electrically connected to the external terminal 400 through the chip pad 210.

A molding layer 300 may be provided on the redistribution substrate 100. The molding layer 300 may cover the top surface 100a of the redistribution substrate 100 and the semiconductor chip 200.

Figure 14:
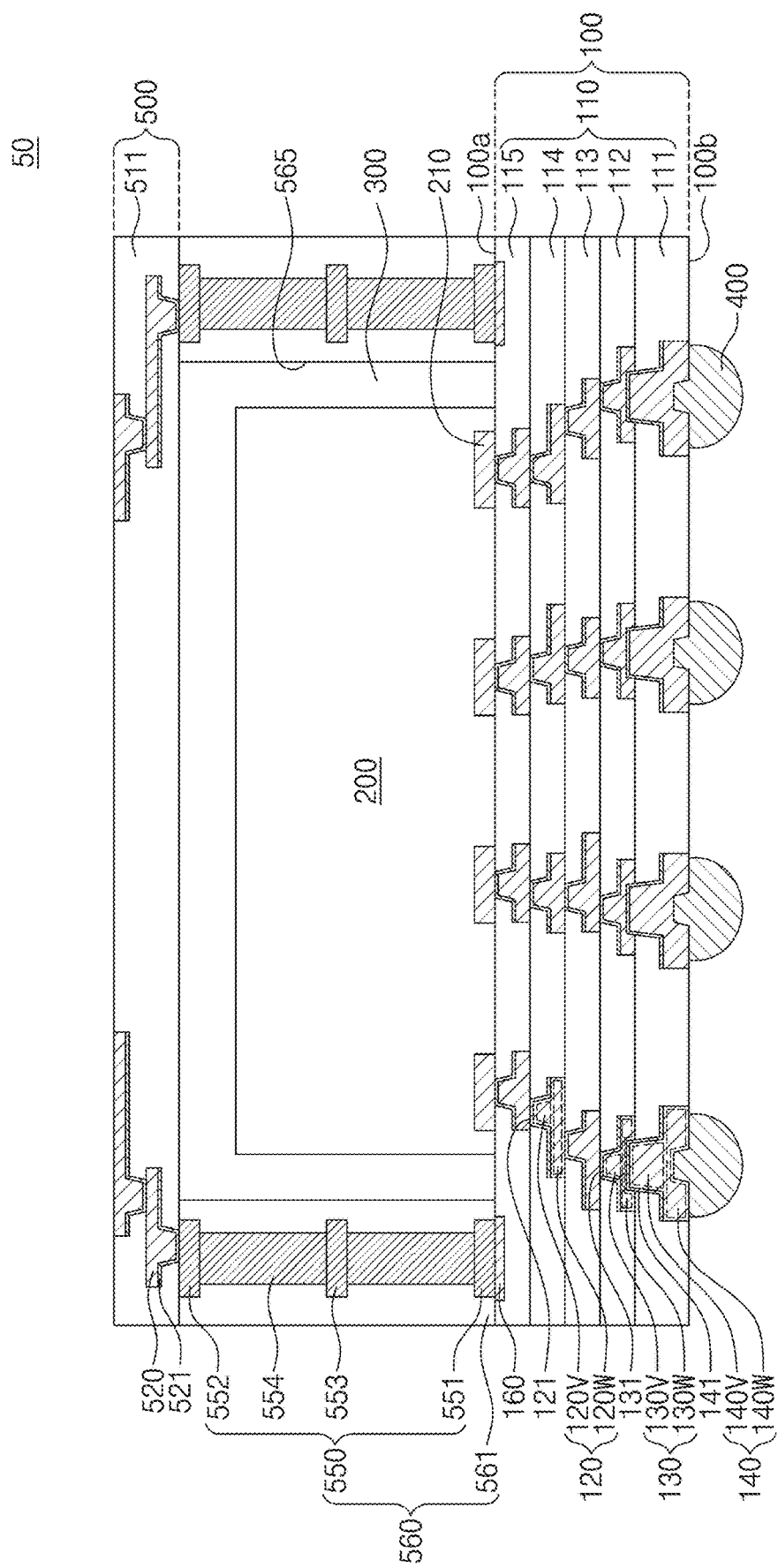
FIG. 14 is a cross-sectional view illustrating a semiconductor package according to some example embodiments of the inventive concepts.

FIG. 14 is a cross-sectional view illustrating a semiconductor package according to some example embodiments of the inventive concepts. Hereinafter, the descriptions to the same components and/or features as in the above embodiments will be omitted for the purpose of ease and convenience in explanation.

Referring to FIG. 14, a semiconductor package 50 may include a redistribution substrate 100, a semiconductor chip 200, a molding layer 300 and an external terminal 400 and may further include an upper redistribution layer 500, a conductive structure 550 and a connection substrate 560. A conductive pattern 160 may be provided on the top surface 100a of the redistribution substrate 100. The conductive pattern 160 may include a conductive metal material, for example, copper (Cu). The redistribution substrate 100, the semiconductor chip 200, the molding layer 300 and the external terminal 400 may be substantially the same as described above with reference to FIG. 13.

The connection substrate 560 may be disposed on the redistribution substrate 100. The connection substrate 560 may have a connection hole 565 penetrating the connection substrate 560. For example, the connection hole 565 may be formed in a printed circuit board (PCB) to manufacture the connection substrate 560. The connection hole 565 may be formed in a central region of the connection substrate 560 when viewed in a plan view. The connection substrate 560 may include the conductive structure 550 and a base layer 561. The base layer 561 may include a single layer or a plurality of stacked layers. The base layer 561 may include an insulating material, for example, a carbon-based material (e.g., graphite or graphene), ceramic, or a polymer (e.g., nylon, polycarbonate, or polyethylene). The connection hole 565 may penetrate the base layer 561.

The conductive structure 550 may be provided on the top surface 100a of the redistribution substrate 100 and may be connected to the conductive pattern 160. The conductive structure 550 may be provided in the base layer 561. The conductive structure 550 may be spaced apart from the semiconductor chip 200. The conductive structure 550 may be electrically connected to the redistribution substrate 100. Thus, the conductive structure 550 may be electrically connected to the semiconductor chip 200 or the external terminal 400 through the redistribution substrate 100. For example, the conductive structure 550 may be a metal pillar. The conductive structure 550 may include a conductive metal material, for example, copper (Cu), aluminum (Al), gold (Au), lead (Pb), stainless steel (SUS), silver (Ag), iron (Fe), and/or any alloy thereof.

The conductive structure 550 may include a first pad 551, a second pad 552, a third pad 553, and vias 554. The first pad 551 may be exposed on a bottom surface of the connection substrate 560. The third pad 553 may be disposed between the base layers 561. The vias 554 may penetrate the base layers 561 and may be connected to the third pad 553. The second pad 552 may be exposed on a top surface of the connection substrate 560 and may be connected to one of the vias 554. The second pad 552 may be electrically connected to the first pad 551 through the vias 554 and the third pad 553. Alternatively, unlike FIG. 14, the second pad 552 may not be vertically aligned with the first pad 551.

The semiconductor chip 200 may be provided in the connection hole 565 of the connection substrate 560. The semiconductor chip 200 may be provided before or after disposing the connection substrate 560.

The molding layer 300 may be formed on the redistribution substrate 100 to fill the connection hole 565. The molding layer 300 may fill a gap between the semiconductor chip 200 and the connection substrate 560 and may cover the semiconductor chip 200. In this case, the semiconductor chip 200 may be fixed to the connection substrate 560 by the molding layer 300. The molding layer 300 may include an insulating polymer such as an epoxy-based polymer. For example, the molding layer 300 may include an adhesive insulating film such as an Ajinomoto build-up film (ABF).

The upper redistribution layer 500 may be provided on the top surface of the connection substrate 560 and the molding layer 300. The upper redistribution layer 500 may include an upper insulating layer 511, upper redistribution patterns 520, and upper seed layers 521.

The upper redistribution layer 500, the upper insulating layer 511, the upper redistribution patterns 520 and the upper seed layer 521 may be substantially the same as described above with reference to FIG. 12.

In the semiconductor package according to some example embodiments of the inventive concepts, the concave dimple structure may be formed in the top surface of the redistribution pattern, and thus a contact area between the pad via and the redistribution pattern may be increased. As a result, even though thermal stress is applied, it is possible to inhibit (or, alternatively, prevent) occurrence of a crack of the pad via and/or a disconnection phenomenon. In addition, according to some example embodiments of the inventive concepts, the dimple structure may be selectively formed in a redistribution pattern, having a high probability of occurrence of a crack, of the redistribution patterns. Thus, occurrence of undulations of the top surfaces of the redistribution patterns may be reduced to inhibit (or, alternatively, prevent) failure of electrical connection. In other words, according to the example embodiments of the inventive concepts, the semiconductor package with improved reliability and electrical characteristics against thermal stress may be provided or realized.

While example embodiments of the inventive concepts have been described with reference to some example embodiments, it will be apparent to those skilled in the art that various changes and modifications may be made without departing from the spirits and scopes of the inventive concepts. Therefore, it should be understood that the above example embodiments are not limiting, but illustrative. Thus, the scope of example embodiments of the inventive concepts are to be determined by the broadest permissible interpretation of the following claims and their equivalents, and shall not be restricted or limited by the foregoing description.

What is claimed is:

1. A semiconductor package comprising:
a semiconductor chip;
a connection terminal; and
a redistribution substrate configured to electrically connect to the semiconductor chip via the connection terminal, the redistribution substrate including,
a pad pattern including a pad via and a pad on the pad via,
a first redistribution pattern including a first via and a first interconnection on the first via, and
a second redistribution pattern between the first redistribution pattern and the pad pattern, the second redistribution pattern including a second via and a second interconnection on the second via, the second interconnection having a recess region therein where a portion of a top surface of the second interconnection is recessed with a bottom surface of the recess region located at a lower level than a topmost surface of the second interconnection, the pad via filling a portion of the recess region such that a bottom surface of the pad via is higher than a bottom surface of the second interconnection in a direction perpendicular to the top surface of the second interconnection.

2. The semiconductor package of claim 1, further comprising:
an external terminal on a bottom surface of the redistribution substrate; and
an under bump pattern in contact with a top surface of the external terminal and electrically connected to the first redistribution pattern.

3. The semiconductor package of claim 1, wherein the redistribution substrate further comprises:
at least one insulating layer covering the first redistribution pattern and the second redistribution pattern, the at least one insulating layer including a photosensitive polymer.

4. The semiconductor package of claim 1, wherein the redistribution substrate further comprises:
at least one fine pattern laterally spaced apart from the first redistribution pattern.

5. The semiconductor package of claim 1, further comprising:
a pad seed pattern covering the bottom surface and an inner sidewall of the recess region.

6. The semiconductor package of claim 1, further comprising:
a chip stack mounted on the redistribution substrate with the chip stack being laterally spaced apart from the semiconductor chip, the chip stack including a plurality of chips vertically stacked on the redistribution substrate.

7. The semiconductor package of claim 1, further comprising:
an insulating layer covering the first redistribution pattern and the second redistribution pattern;
a first seed pattern between the insulating layer and a bottom surface of the first redistribution pattern; and
a second seed pattern between the insulating layer and a bottom surface of the second redistribution pattern.

8. The semiconductor package of claim 1, wherein, in a direction parallel to the top surface of the redistribution substrate, widths of a top of the first via and a top of the second via are greater than widths of a bottom of the first via and a bottom of the second via, respectively.

9. The semiconductor package of claim 1, wherein a thickness between the bottom surface of the recess region and the topmost surface of the second interconnection ranges from 1 μm to 5 μm.

10. The semiconductor package of claim 1, wherein a width of the bottom surface of the recess region ranges from 5 μm to 15 μm.

11. A semiconductor package comprising:
a semiconductor chip;
a connection terminal;
a redistribution substrate configured to electrically connect to the semiconductor chip via the connection terminal, the redistribution substrate including,
an under bump pattern,
a first redistribution pattern on the under bump pattern,
a second redistribution pattern on the first redistribution pattern, the second redistribution pattern including a second via and a second interconnection on the second via, the second interconnection having a recess region therein where a portion of a top surface of the second interconnection is recessed, at least one fine pattern on the under bump pattern and laterally spaced apart from the first redistribution pattern and the second redistribution pattern, an insulating layer covering the first redistribution pattern, the second redistribution pattern and the at least one fine pattern, a pad pattern including a pad via and a pad on the pad via, the pad via filling a portion of the recess region such that a bottom surface of the pad via is higher than a bottom surface of the second interconnection in a direction perpendicular to the top surface of the second interconnection, and a pad seed pattern between the pad pattern and the insulating layer, the pad seed pattern covering an inner sidewall and a bottom surface of the recess region; and an external terminal on a bottom surface of the redistribution substrate such that the external terminal contacts the under bump pattern.

12. The semiconductor package of claim 11, further comprising:

a first seed pattern between the insulating layer and a bottom surface of the first redistribution pattern; and a second seed pattern between a bottom surface of the second via and a top surface of the first redistribution pattern, between a sidewall of the second via and the insulating layer and between the bottom surface of the second interconnection and the insulating layer.

13. The semiconductor package of claim 11, wherein, in a direction parallel to the top surface of the redistribution substrate, a width of a top of the pad via is greater than a width of a bottom of the pad via.

14. The semiconductor package of claim 11, wherein the first redistribution pattern comprises:

a first via; and a first interconnection on the first via.

15. The semiconductor package of claim 11, further comprising:

a molding layer covering the top surface of the redistribution substrate and the semiconductor chip.

16. The semiconductor package of claim 11, wherein the bottom surface of the recess region is at a lower level than a topmost surface of the second interconnection.

* * * * *